(12) United States Patent
Wang et al.

(10) Patent No.: US 9,079,793 B2
(45) Date of Patent: Jul. 14, 2015

(54) OPTICAL FIBER AND METHOD FOR MANUFACTURING SAME

(71) Applicant: NATIONAL SUN YAT-SEN UNIVERSITY, Kaohsiung (TW)

(72) Inventors: Jau-Sheng Wang, Kaohsiung (TW); Yung-Hsin Tseng, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 133 days.

(21) Appl. No.: 14/061,054

(22) Filed: Oct. 23, 2013

(65) Prior Publication Data

US 2014/0119692 A1    May 1, 2014

(30) Foreign Application Priority Data

Nov. 1, 2012    (TW) .............................. 101140544 A

(51) Int. Cl.
*G02B 6/42* (2006.01)
*G02B 6/02* (2006.01)
(Continued)

(52) U.S. Cl.
CPC ............. *C03B 37/027* (2013.01); *C03B 37/022* (2013.01); *C04B 35/62231* (2013.01); *C04B 35/62259* (2013.01); *C04B 35/62847* (2013.01); *C30B 13/005* (2013.01); *C30B 13/24* (2013.01); *C30B 29/30* (2013.01); *C30B 29/32* (2013.01);
(Continued)

(58) Field of Classification Search
CPC ............ G02B 6/00; G02B 6/26; G02B 6/262; G02B 6/42; C03B 37/01; C03B 37/0253; C03B 37/022; C03B 37/027; C03B 37/07; C03B 37/14; C03B 37/15; G02F 1/01; G02F 1/0316; G02F 1/035; G02F 1/225; G02F 1/29; C04B 35/62231; C04B 35/62259; C04B 35/62847; C04B 2235/5264; C30B 29/30; C30B 29/32; C30B 13/005; C30B 13/24
USPC ......... 385/2–3, 12, 27, 39–40, 122, 123, 147; 356/459–466; 65/423–430; 250/227.14, 227.18
See application file for complete search history.

(56) References Cited

U.S. PATENT DOCUMENTS

| 6,502,429 B1 | 1/2003 | Abe |
| 7,317,847 B1 * | 1/2008 | Wang et al. ................. 385/3 |
| 7,486,401 B2 * | 2/2009 | Sanders .................. 356/461 |

OTHER PUBLICATIONS

Wang et al., "ITO electrode-embedded double-cladding single-crystal LiNbO3 optical fiber", Optics Letters, Feb. 15, 2013, pp. 452-454, vol. 38, No. 4.

*Primary Examiner* — km Enayet Ullah
*Assistant Examiner* — Michael Mooney
(74) *Attorney, Agent, or Firm* — Muncy, Geissler, Olds & Lowe, P.C.

(57) ABSTRACT

A method for manufacturing an optical fiber includes melting an end of a crystal material and drawing the molten end of the crystal material to form a crystal filament. Conductive paint is coated on two surface sections of the crystal filament to form internal positive and negative electrodes not electrically connected to each other. The crystal filament is placed into a heat resistant tube that is heated until an outer layer of the crystal filament melts and adheres to an inner periphery of the heat resistant tube, with a center of the crystal filament remaining as a solid core. Conductive paint is adhered to two ends of the crystal filament to form external positive and negative electrodes electrically connected to the internal positive and negative electrodes, respectively. The optical fiber thus formed can serve as a photoelectric optical fiber for transmission of current signals.

11 Claims, 5 Drawing Sheets

(51) Int. Cl.
*G02B 6/36* (2006.01)
*C03B 37/01* (2006.01)
*C03C 25/10* (2006.01)
*C03B 37/027* (2006.01)
*G02B 6/26* (2006.01)
*C03B 37/022* (2006.01)
*C30B 13/00* (2006.01)
*C30B 13/24* (2006.01)
*C30B 29/30* (2006.01)
*C30B 29/32* (2006.01)
*C04B 35/622* (2006.01)
*C04B 35/628* (2006.01)
*C03B 37/012* (2006.01)
*C03B 37/026* (2006.01)

(52) U.S. Cl.
CPC .............. *G02B 6/26* (2013.01); *C03B 37/01211* (2013.01); *C03B 37/01245* (2013.01); *C03B 37/026* (2013.01); *C03B 37/02754* (2013.01); *C04B 2235/5264* (2013.01); *G02B 6/262* (2013.01)

OPTICAL FIBER AND METHOD FOR MANUFACTURING SAME

BACKGROUND OF THE INVENTION

1. Field of the Invention

The present invention relates to an optical fiber and a method for manufacturing the optical fiber and, more particularly, to an optical fiber having internal electrodes and a method for manufacturing the optical fiber having internal electrodes.

2. Description of the Related Art

Conventional optical fibers play an important role in communication, detection, and photoelectric fields. Recently, optical fiber gyroscopes are widely used in cell phones, navigation, and flight, wherein phase modulation can be achieved through transmission of signals and optical energy by optical fibers with electrodes.

In a conventional approach of producing internal electrodes in an optical fiber, a plurality of holes is drilled in a preform made of quartz glass, and a positive electrode, a negative electrode and a fiber core made of the same material as the preform are inserted into the holes. Next, an end of the preform is heated to melt, and general optical fiber drawing is carried out at the molten end of the preform. In another approach, after drilling holes in the preform made of quartz glass, a fiber core made of the same material as the preform is inserted into one of the holes. Next, general optical fiber drawing is carried out at the molten end of the preform after heating an end of the preform to melt. Then, electrode materials for forming a positive electrode and a negative electrode are heated and poured into the remaining holes to accomplish production of the optical fiber with electrodes.

Although the above approaches can produce optical fibers with internal electrodes, if the above approaches are used in producing optical fibers including fiber cores made of a crystal material, the preform is generally heated to a temperature above 1800° C., such that the positive and negative electrodes and the crystal fiber cores melt during the optical fiber drawing procedure or even melt together in a lump, failing to provide desired integrity of the positive and negative electrodes and the crystal fiber cores. Thus, the conventional production methods can not be used to produce crystal fibers with internal electrodes and crystal fiber cores. Furthermore, the crystal fiber cores could melt thoroughly under an excessively high temperature and, thus, lose their functions. Furthermore, in production of both of conventional optical fibers and crystal fibers, drilling holes in the preforms require extremely high accuracy, adding difficulties in troublesome production procedures and reducing the efficiency of the conventional methods.

On the other hand, since the conventional production methods requiring high-temperature processing can not be used on crystal fibers, in a case that crystal is used as the element material, the volume of the crystal is limited by the size of the conventional waveguide element and, thus, can not be replaced by crystal fibers, resulting in a great obstacle in miniaturization of current products.

Thus, a need exists for a novel method suitable for manufacturing a crystal fiber with internal electrodes without the above disadvantages.

SUMMARY OF THE INVENTION

An objective of the present invention is to provide a method suitable for manufacturing a crystal fiber without the need of forming a preform and drilling holes in the preform, simplifying the procedures while obtaining an optical fiber with internal positive and negative electrodes.

Another objective of the present invention is to provide a method for manufacturing an optical fiber with simplified procedures to increase the optical fiber manufacturing efficiency.

A further objective of the present invention is to provide an optical fiber including intact positive and negative electrodes and an integral fiber core to maintain the characteristics of the optical fiber.

The present invention fulfills the above objectives by providing, in an aspect, a method for manufacturing an optical fiber including heating an end of a crystal material to melt and drawing the molten end of the crystal material to form a crystal filament. The crystal filament includes an outer periphery having a first surface section and a second surface section spaced from the first surface section along a longitudinal plane of the crystal filament. Conductive paint is coated on the first and second surface sections of the crystal filament to form an internal positive electrode and an internal negative electrode not electrically connected to the positive negative electrode. The crystal filament with the internal positive and negative electrodes is placed into a heat resistant tube. The heat resistant tube is heated until an outer layer of the crystal filament melts and adheres to an inner periphery of the heat resistant tube, with a center of the crystal filament remaining as a solid core. Conductive paint is adhered to two ends of the crystal filament to form an external positive electrode and an external negative electrode electrically connected to the internal positive electrode and the internal negative electrode, respectively.

Preferably, a heat collection tube is mounted around the heat resistant tube receiving the crystal filament. The heat resistant tube is movable relative to the heat collection tube along a longitudinal axis of the heat collection tube. The heat collection tube is heated to supply heat to the heat resistant tube. Preferably, heating the heat collection tube includes concentrating laser beams on the heat collection tube after moving through a slant reflective mirror and a focusing mirror.

Preferably, the heat collection tube is made of sapphire.

Preferably, the crystal filament is placed in a V-shaped groove, and the conductive paint is deposited on the first and second surface sections by vacuum evaporation deposition to form the internal positive and negative electrodes.

Preferably, the end of the crystal material is heated and melted by laser beams.

Preferably, the crystal material is lithium niobate, titanium-doped lithium niobate, strontium barium niobate, or barium titanate.

Preferably, the conductive paint is indium tin oxide, fluorine-doped tin oxide, or al-doped zinc oxide.

Preferably, the heat resistant tube is made of silicon dioxide.

In another aspect, an optical fiber includes a crystal fiber having a heat resistant tube and a crystal filament received in the heat resistant tube. An internal positive electrode and an internal negative electrode are sandwiched between an outer periphery of the crystal filament and an inner periphery of the heat resistant tube. The internal positive electrode is not electrically connected to the internal negative electrode. The crystal filament encloses a solid core in a center thereof. An external positive electrode is mounted on an end of the crystal fiber and electrically connected to the internal positive electrode. An external negative electrode is mounted on another end of the crystal fiber and electrically connected to the internal negative electrode.

Preferably, the heat resistant tube is a silicon dioxide tube.

The present invention will become clearer in light of the following detailed description of illustrative embodiments of this invention described in connection with the drawings.

DETAILED DESCRIPTION OF THE INVENTION

A method for manufacturing an optical fiber according to the present invention is preferably used to, but not limited to, manufacture a crystal fiber to provide a breakthrough in conventional methods. Thus, although the method according to the present invention is described by way of example of manufacture of a crystal fiber, a person skilled in the art can use the method to manufacture optical fibers of other types.

The term "crystal fiber" referred to herein means an optical fiber made of a crystal material whose molecules are arranged in a single pattern different from conventional optical fibers, because some of the characteristics of the crystal can be maintained only in a single crystal, which is well known in the art.

The method for manufacturing an optical fiber will now be described.

Figure 1A:
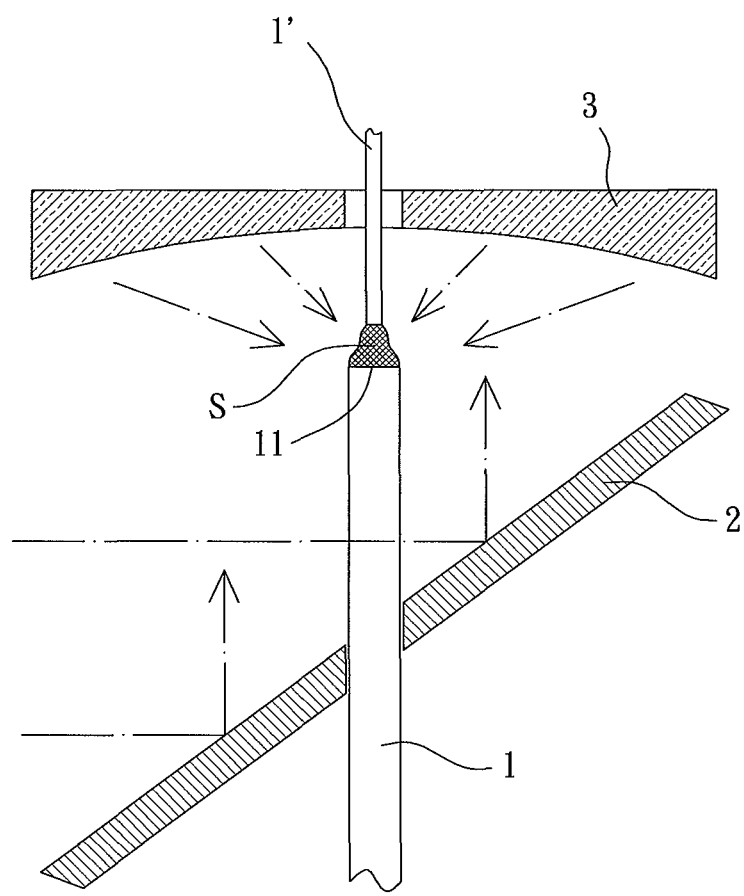
FIG. 1a is a diagrammatic view illustrating a procedure of a step of a method for manufacturing an optical fiber according to the present invention, with an end of a preform melted.
Figure 1B:
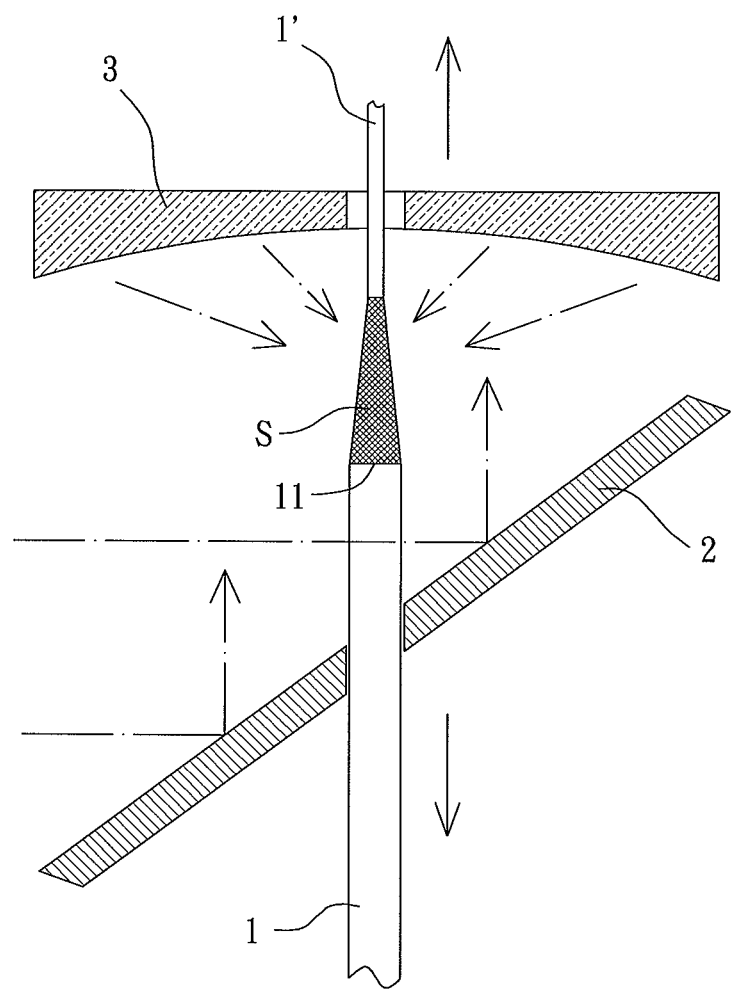
FIG. 1b is a diagrammatic view illustrating another procedure of the step of the method for manufacturing an optical fiber according to the present invention, with optical fiber drawing carried out at the molten end of the preform.

With reference to FIGS. 1a and 1b, the method includes heating a crystal material 1 until an end 11 of the crystal material 1 melt. Then, the molten end 11 is drawn to form a crystal filament S. Specifically, the crystal material can be a solid material such as lithium niobate ($LiNbO_3$), titanium-doped lithium niobate, strontium barium niobate, barium titanate, etc. In an example of the method according to the present invention, the crystal material 1 is lithium niobate, and the crystal filament S is formed by filament drawing using laser heated pedestal growth (LHPG), which is well know in the art.

In this example, a lithium niobate crystal rod (namely, the crystal material, which will be referred to as "crystal rod 1" hereinafter) having a diameter of 500 μm extends through a slant reflective mirror 2 and is fixed (FIG. 1a). A focusing mirror 3 is located in front of the slant reflective mirror 2 and has a focusing surface 31 facing the end 11 of the crystal rod 1. Laser beams are guided to and reflected by the slant reflective mirror 2 to the focusing mirror 3. The focusing surface 31 concentrate the laser beams on the end 11 of the crystal rod 1. The laser beams continuously provide a power of about 12 W until the end 11 of the crystal rod 1 melt. Another lithium niobate crystal rod 1' (hereinafter referred to as "crystal rod 1'") adheres to the molten end 11 of the crystal rod 1. Then, the crystal rods 1 and 1' are moved relative to each other at a speed such that the crystal rods 1 and 1' move away from each other and are drawn in opposite directions indicated by arrows in FIG 1b. Filament drawing can be carried out to form the crystal filament S after the molten crystal materials at the ends of the crystal rods 1 and 1' break and separate from each other after cooling.

The relative speed between the crystal rods 1 and 1' can be varied according to different sizes of the crystal filament S. As an example, the crystal rod 1 moves at a speed of 0.5 mm/min, and the other crystal rod 1' moves at a speed of 2 mm/min. Namely, the speed ratio of the crystal rod 1 to the crystal rod 1' is 1:4 to obtain a crystal filament S having a diameter of about 300 μm. In another example, the crystal rod 1 moves at a speed of 0.1 mm/min, and the other crystal rod 1' moves at a speed of 2 mm/min. Namely, the speed ratio of the crystal rod 1 to the crystal rod 1' is 1:18 to obtain a crystal filament S having a diameter of about 70 μm.

The above procedures can be appreciated by a person having ordinary skill in the art. The type of the crystal filament S can be changed, and the speed ratio of the crystal rods 1 and 1' can be controlled to obtain the crystal filament S of a desired size.

With reference to FIGS. 2a-2d, the crystal filament S prepared includes a first surface section S1 and a second surface section S2 spaced from the first surface section S1 by a longitudinal plane of the crystal filament S, and conductive paint P is coated on the first surface section S1 and the second surface section S2 to form an internal positive electrode and an internal negative electrode. Specifically, in this example, the crystal filament S is placed in a V-shaped trough 4 made of glass, and the conductive paint P is deposited on the outer periphery of the crystal filament S by vacuum evaporation deposition. The conductive paint P can be a temperature-resistant electrically conductive oxide such as indium tin oxide (ITO), fluorine-doped tin oxide (FTO), al-doped zinc oxide (AZO).

Figure 2A:
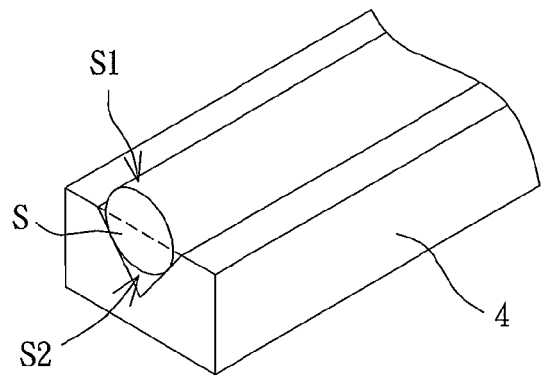
FIG. 2a is a partial, perspective view of a crystal filament placed in a glass trough.
Figure 2B:
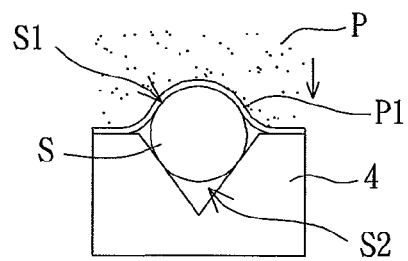
FIG. 2b is a side view of the crystal filament and the glass trough of FIG. 2a, illustrating formation of a positive electrode.
Figure 2C:
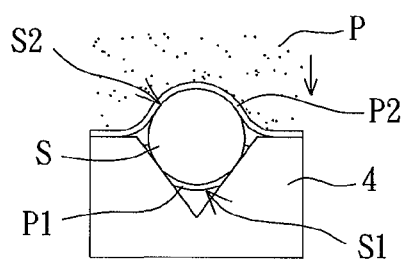
FIG. 2c is a side view similar to FIG. 2b, illustrating formation of a negative electrode.
Figure 2D:
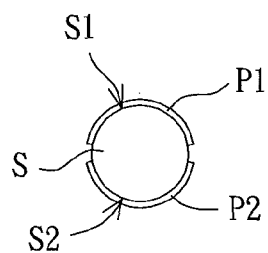
FIG. 2d is a side view of the crystal filament with the positive and negative electrodes.

In this example, the crystal filament S having a diameter of about 70 μm is placed in the V-shaped trough 4, and a vacuum tape is adhered to an end of the crystal filament S. A portion of the crystal filament S exposed outside of the V-shaped trough 4 is the first surface section S1, and a portion of the crystal filament S received in the V-shaped trough 4 is the second surface section S2. With reference to FIG. 2b, vacuum evaporation deposition is carried out on the first surface section S1 such that indium tin oxide (the conductive paint P) is heated and vaporized into indium tin vapor and completely adheres to the first surface section S1 to form an internal electrode (the internal positive electrode P1). With reference to FIG. 2c, the crystal filament S is then rotated to a position in which the second surface section S2 is exposed outside of the V-shaped trough 4. Next, vacuum evaporation deposition is carried out on the second surface section S2 to adhere indium tin vapor to the second surface section S2 to form another internal electrode (the internal negative electrode P2). The thickness of each of the internal positive and negative electrodes P1 and P2 is preferably about 300 nm.

In addition to deposition of the conductive paint P on the crystal filament S by vacuum evaporation deposition, a person having ordinary skill in the art can take other film forming measures such as DC reactive magnetron sputtering, radio frequency (RF) reactive magnetron sputter, and chemical vapor deposition (CVD) to assure reliable adherence of the conductive paint P on the outer periphery of the crystal filament S.

After the internal positive and negative electrodes P1 and P2 are coated on the crystal filament S, the crystal filament S is inserted into a heat resistant tube 5 (FIG. 3) that is heated until an outer layer of the crystal filament S softens and adheres to an inner periphery of the heat resistant tube 5, and the center of the crystal filament S remains as a solid core S3. Specifically, the heat resistant tube 5 is made of silicon dioxide (namely, the heat resistant tube 5 is a quartz tube) and preferably has an inner diameter of 75 μm and an outer diameter of 150 μm to allow the crystal filament S to extend therethrough. Thus, the heat energy absorbed by the heat resistant tube 5 can reliably be distributed throughout the outer periphery of the crystal filament S such that the core S3 remains solid when the outer layer of the crystal filament S softens (FIG. 4).

Furthermore, a heat collection tube 6 can be mounted around the heat resistant tube 5 to enclose a portion of the heat resistant tube 5. The heat collection tube 6 can be made of sapphire to provide a uniform focusing effect for uniform heating. The size of the heat collection tube 6 can be selected according to need. In this example, the heat collection tube 6 is made of sapphire and has an inner diameter of 1200 μm, an outer diameter of 480 μm, and a length of 3 mm. The heat resistant tube 5 extends through the heat collection tube 6 and is movable relative to the heat collection tube 6 along a longitudinal axis of the heat collection tube 6.

Figure 3:
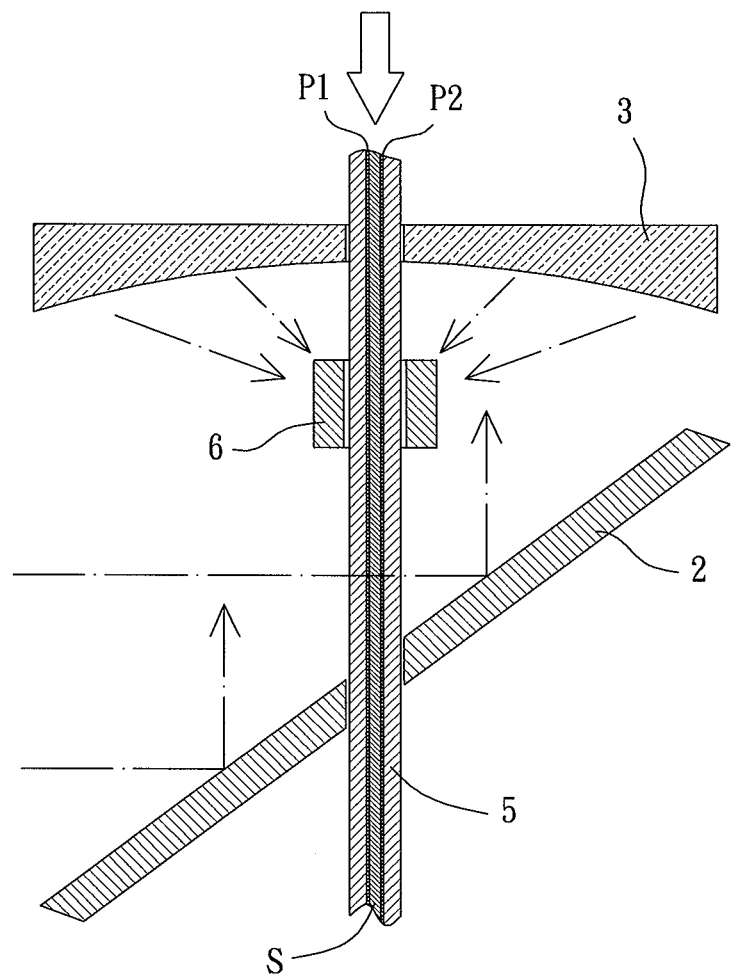
FIG. 3 is a diagrammatic view illustrating another step of the method for manufacturing an optical fiber according to the present invention.
Figure 4:
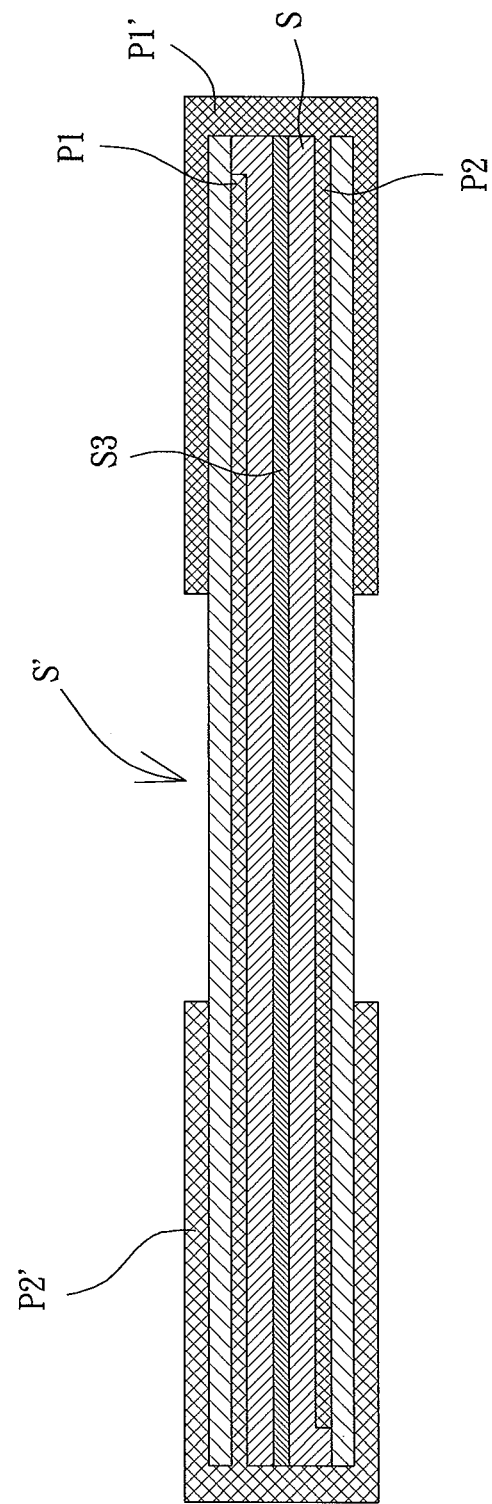
FIG. 4 is a cross sectional view of an optical fiber according to the present invention.

With reference to FIG. 3, in this example, a device using a method similar to laser heated pedestal growth (LHPG) is used to make the beams from the laser pass through the slant reflective mirror 2 and the focusing mirror 3 and then concentrate on the heat collection tube 6. The heat resistant tube 5 is operated to move slowly through the heat collection tube 6 at a speed of 1 mm/min until the outer periphery of the crystal filament S is uniformly heated and melts, leading to softening of the outer layer of the crystal filament S. Thus, the softened outer layer of the crystal filament S melts and adheres to the inner periphery of the heat resistant tube 5 and encloses the internal positive and negative electrodes P1 and P2. Preferably, the power of the laser is controlled to be 45 W to prevent the inner layer of the crystal filament S from softening while remaining the solid core S3 (see FIG. 4), accomplishing manufacture of a crystal fiber S'.

Heating by laser beams is known in the art and has been described in detail in the procedure of initial formation of the crystal filament S. Redundant description is not required.

After forming the crystal fiber S' through the above procedures, conductive paint P can be coated on two ends of the crystal fiber S' to form an external positive electrode P1' electrically connected to the internal positive electrode P1 and an external negative electrode P2' electrically connected to the internal negative electrode P2 (see FIG. 4). Specifically, in this example, the conductive paint P is indium tin oxide and coated on two ends of the crystal fiber S' by vacuum evaporation deposition to form the external positive electrode P1' electrically connected to the internal positive electrode P1 and the external negative electrode P2' electrically connected to the internal negative electrode P2. Preferably, the thickness of each of the external positive and negative electrodes P1' and P2' is about 300 nm. An optical fiber with electrodes shown in FIG. 4 is, thus, obtained.

In view of the foregoing, the main features of the method for manufacturing an optical fiber according to the present invention are that the crystal fiber can be manufactured by coating the crystal filament S with the internal positive and negative electrodes P1 and P2, by laser heating the crystal filament S to soften the outer layer of the crystal filament S to adhere the outer layer of the crystal filament S to the inner periphery of the heat resisting tube 5, and by controlling the laser power to avoid melting of the inner layer of the crystal filament S while maintaining the solid core S3. Furthermore, the external positive and negative electrodes P1' and P2' respectively connected to the internal positive and negative electrodes P1 and P2 are coated on two ends of the crystal filament S to form the optical fiber according to the present invention that can be used as a photoelectric optical fiber to transmit current signals. Thus, the method for manufacturing an optical fiber according to the present invention is suitable to manufacture a crystal fiber without troublesome procedures of preparing a preform and drilling holes in the preform. The manufacturing procedures are simplified, and the internal positive and negative electrodes P1 and P2 can be completely enclosed, increasing the manufacturing efficiency of the optical fiber.

Furthermore, the optical fiber manufactured by the method according to the present invention is a crystal fiber S' (FIG. 4) whose two ends are enclosed by the external positive and negative electrodes P1' and P2'. The crystal fiber S' includes a heat resistant tube 5 and a crystal filament S received in the heat resistant tube 5. The crystal filament S has first and second surface sections S1 and S2 spaced from each other by the longitudinal plane of the crystal filament S. An internal positive electrode P1 is sandwiched between the first surface section S1 and the heat resistant tube 5 and is electrically connected to the external positive electrode P1'. An internal negative electrode P2 is sandwiched between the second surface section S2 and the heat resistant tube 5 and is electrically connected to the external negative electrode P2'. The internal negative electrode P2 is not electrically connected to the internal positive electrode P1. Furthermore, the crystal filament S includes a solid core S3. Thus, the optical fiber manufactured by the method according to the present invention possesses integral positive and negative electrodes P1, P2, P1', and P2' and an integral core S3. Namely, the positive and negative electrodes P1, P2, P1', and P2' and the core S3 do not melt in a lump under high heat during formation of the optical fiber, assuring the quality of the optical fiber produced and providing enhanced effect in transmission of current signals.

Although specific embodiments have been illustrated and described, numerous modifications and variations are still possible without departing from the scope of the invention. The scope of the invention is limited by the accompanying claims.

What is claimed is:

1. A method for manufacturing an optical fiber comprising:
heating an end of a crystal material to melt, and drawing the molten end of the crystal material to form a crystal filament, with the crystal filament including an outer periphery having a first surface section and a second surface section spaced from the first surface section along a longitudinal plane of the crystal filament;
coating conductive paint on the first and second surface sections of the crystal filament to form an internal positive electrode and an internal negative electrode not electrically connected to the positive negative electrode;
placing the crystal filament with the internal positive and negative electrodes into a heat resistant tube, and heating the heat resistant tube until an outer layer of the crystal filament melts and adheres to an inner periphery of the heat resistant tube, with a center of the crystal filament remaining as a solid core; and adhering conductive paint to two ends of the crystal filament to form an external positive electrode and an external negative electrode electrically connected to the internal positive electrode and the internal negative electrode, respectively.

2. The method as claimed in claim 1, further comprising:
mounting a heat collection tube around the heat resistant tube receiving the crystal filament, with the heat resistant tube movable relative to the heat collection tube along a longitudinal axis of the heat collection tube; and
heating the heat collection tube to supply heat to the heat resistant tube.

3. The method as claimed in claim 2, wherein heating the heat collection tube includes concentrating laser beams on the heat collection tube after moving through a slant reflective mirror and a focusing mirror.

4. The method as claimed in claim 2, wherein the heat collection tube is made of sapphire.

5. The method as claimed in claim 1, wherein the crystal filament is placed in a V-shaped groove, and the conductive paint is deposited on the first and second surface sections by vacuum evaporation deposition to form the internal positive and negative electrodes.

6. The method as claimed in claim 1, wherein the end of the crystal material is heated and melted by laser beams.

7. The method as claimed in claim 1, wherein the crystal material is lithium niobate, titanium-doped lithium niobate, strontium barium niobate, or barium titanate.

8. The method as claimed in claim 1, wherein the conductive paint is indium tin oxide, fluorine-doped tin oxide, or al-doped zinc oxide.

9. The method as claimed in claim 1, wherein the heat resistant tube is made of silicon dioxide.

10. An optical fiber comprising:
a crystal fiber including a heat resistant tube and a crystal filament received in the heat resistant tube, with an internal positive electrode and an internal negative electrode sandwiched between an outer periphery of the crystal filament and an inner periphery of the heat resistant tube, with the internal positive electrode not electrically connected to the internal negative electrode, with the crystal filament enclosing a solid core in a center thereof;
an external positive electrode mounted on an end of the crystal fiber and electrically connected to the internal positive electrode; and
an external negative electrode mounted on another end of the crystal fiber and electrically connected to the internal negative electrode.

11. The optical fiber as claimed in claim 10, wherein the heat resistant tube is a silicon dioxide tube.

* * * * *